United States Patent
Chang et al.

(10) Patent No.: US 7,208,796 B2
(45) Date of Patent: Apr. 24, 2007

(54) SPLIT GATE FLASH MEMORY

(75) Inventors: Ko-Hsing Chang, Hsinchu (TW); Wu-Tsung Chung, Miaoli County (TW); Tsung-Cheng Huang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/163,223

(22) Filed: Oct. 11, 2005

(65) Prior Publication Data

US 2006/0208307 A1    Sep. 21, 2006

(30) Foreign Application Priority Data

Mar. 21, 2005   (TW) .............................. 94108557 A

(51) Int. Cl.
*H01L 29/788* (2006.01)

(52) U.S. Cl. ...................... 257/315; 257/314; 257/239; 257/261; 257/E29.3; 257/E21.422; 438/201; 365/185.01; 365/185.24

(58) Field of Classification Search ...................... None
See application file for complete search history.

(56) References Cited

U.S. PATENT DOCUMENTS 5,889,304 A * 3/1999 Watanabe et al. ........... 257/321

OTHER PUBLICATIONS

Article titled "Scaling of CMOS FinFETs towards 10 nm" jointly authored by Chen et al., IEEE, pp. 46-48, 2003.

* cited by examiner

*Primary Examiner*—Leonardo Andujar
*Assistant Examiner*—Scott R. Wilson
(74) *Attorney, Agent, or Firm*—Jianq Chyun IP Office

(57) ABSTRACT

A split gate flash memory is provided. Trenches are formed in the substrate to define active layers. The device isolation layers are formed in the trenches. The surface of the device isolation layers is lower than the surface of the active layers. The stacked gate structures each including a tunneling dielectric layer, a floating gate and a cap layer are formed on the active layers. The inter-gate dielectric layers are formed on the sidewalls of the stacked gate structures. The select gates are formed on one side of the stacked gate structure and across the active layer. The select gate dielectric layers are formed between the select gates and the active layers. The source regions are formed in the active layers on the other side of the stacked gate structures. The drain regions are formed in the active layers on one side of the select gates.

19 Claims, 13 Drawing Sheets

SPLIT GATE FLASH MEMORY

CROSS-REFERENCE TO RELATED APPLICATION

This application claims the priority benefit of Taiwan application serial no. 94108557, filed on Mar. 21, 2005. All disclosure of the Taiwan application is incorporated herein by reference.

BACKGROUND OF THE INVENTION

1. Field of the Invention

The present invention relates to a semiconductor device. More particularly, the present invention relates to a split gate flash memory and manufacturing method thereof.

2. Description of the Related Art

Among the various types of non-volatile memory products, flash memory device is a memory device that has been widely used inside personal computer systems and electron equipment. In the flash memory, data can be stored, read out or erased many numerous times and stored data are retained even after power is cut off.

Typically, the floating gate and the control gate of a flash memory cell are fabricated by doped polysilicon. Furthermore, the floating gate and the control gate are isolated from each other through a dielectric layer and the floating gate and the substrate are isolated from each other through a tunneling oxide layer. To perform a data write/erase operation on the flash memory, a biased voltage is applied to the control gate and the source/drain regions. As a result, electrons are injected into the floating gate or pulled out from the floating gate. To read data from a flash memory, an operating voltage is applied to the control gate so that the charging state of the floating gate will effect the 'on' or 'off' state of the channel underneath. Consequently, the 'on' or 'off' state of the channel can be used to determine if a '0' or '1' data bit is read out.

Because the quantity of electric charges expelled from the floating gate when erasing data from the aforementioned flash memory is difficult to control, too many charges may be expelled from the floating gate leading to the floating gate having a net positive charge, the so-called 'over-erasing'. If the degree of over-erasing is severe, the channel underneath the floating gate may continue to be conductive even though no operation voltage is applied to the control gate. As a result, errors in reading from the flash memory may occur.

To resolve the over-erasing problem, a flash memory with a split gate structure has been developed. FIG. 1 is a schematic cross-sectional view showing the structure of a conventional split-gate flash memory cell. The flash memory cell in FIG. 1 has a structure including a tunneling dielectric layer 102, a floating gate 104, an inter-gate dielectric layer 106 and a select gate 108 sequentially formed over a substrate 100. Aside from covering the floating gate 104, a portion of the select gate 108 also extends to cover an area above the substrate 100. The select gate 108 is isolated from the substrate 100 through a select gate dielectric layer 110. The source region 112 is formed in the substrate 100 on one side of the floating gate 104. The drain region 114 is formed in the substrate 100 on the same side as the extension of the select gate 108. With this setup, even when the over-erasing problem is so severe that the channel underneath the floating gate 104 remains open in the absence of an operating voltage to the select gate 108, the channel underneath the select gate 108 is still maintained in the shut-down state. Thus, the drain region 114 and the source region 112 are cut off from each other and reading error is prevented.

However, a split gate structure needs a larger area to accommodate the split gate so that the size of each memory cell has to increase. Thus, the memory cell with a split gate structure must occupy a larger area compared with the memory cell with a stacked gate structure. In other words, the level of integration of the devices can hardly increase.

Furthermore, as the level of integration of integrated circuits continues to increase through miniaturization, the dimension of each memory cell can be reduced by shortening the length of the gate. Yet, a shorter gate length will lead to a reduction of the channel length underneath the gate. With a shorter channel, the chance of having an abnormal punch through between the drain region and the source region is increased during memory cell programming. Ultimately, the electrical performance of the memory cell will be seriously affected.

SUMMARY OF THE INVENTION

Accordingly, at least one objective of the present invention is to provide a split gate flash memory cell and manufacturing method thereof. The split gate memory cell has a three-dimensional channel path and can provide a longer channel length. Thus, the level of integration of the memory devices can be increased.

To achieve these and other advantages and in accordance with the purpose of the invention, as embodied and broadly described herein, the invention provides a split gate flash memory. The split gate flash memory includes a substrate, at least an active layer, a plurality of device isolation layers and at least a memory cell. The active layer is formed on the substrate to protrude above the surface of the substrate. The device isolation layers are formed on the sides of the active layer. Furthermore, the surface of the device isolation layer is lower than the surface of the active layer. The memory cell is formed on the substrate. The memory cell includes a stacked gate structure, a select gate, a source region and a drain region. The stacked gate structure includes at least a floating gate that crosses over the active layer. The select gate is formed on a first side of the stacked gate structure across the active layer. The source region is formed in the active layer on a second side of the stacked gate structure. The source region extends to an area underneath the floating gate. The second side and the first side are reciprocal to each other. The drain region is formed in the active layer on one side of the select gate.

The aforementioned split gate flash memory further includes an inter-gate dielectric layer formed on the sidewall of the stacked gate structure. The inter-gate dielectric layer can be fabricated by silicon oxide, for example.

The aforementioned split gate flash memory further includes a select gate dielectric layer formed between the select gate and the active layer. The select gate dielectric layer is fabricated by silicon oxide, for example.

In the aforementioned split gate flash memory, the stacked gate structure further includes a tunneling dielectric layer formed between the floating gate and the active layer. The tunneling dielectric layer can be fabricated by silicon oxide, for example.

In the aforementioned split gate flash memory, the stacked gate structure further includes a cap layer formed between the floating gate and the select gate. The floating gate and the select gate can be fabricated by doped polysilicon, for example.

The present invention also provides an alternative split gate flash memory. The split gate flash memory includes a substrate, a plurality of first active layers, a plurality of second active layers, a plurality of device isolation structures, a first memory cell and a second memory cell. The first active layers are formed on the substrate. The first active layers are aligned in a first direction parallel to one another to protrude above the surface of the substrate. The second active layers are formed on the substrate. The second active layers are aligned in a second direction parallel to one another such that the second direction and the first direction are formed across each other. The device isolation layers are formed on the sides of the first active layers. The surface of the device isolation layers is lower than the surface of the first active layers. The first memory cell is formed on the substrate across the first active layer. The first memory cell includes a stacked gate structure, a select gate, a source region and a drain region. The stacked gate structure includes at least a floating gate that formed across the first active layer. The select gate is formed on a first side of the stacked gate structure across the first active layer. The source region is formed in the first active layer on a second side of the floating gate. The second side and the first side are reciprocal to each other. The drain region is formed in the first active layer on one side of the select gate. The second memory cell is formed on the substrate across the first active layer. The second memory cell has a structure identical and symmetry to the first memory cell. The second and the first memory cell share the same source region.

In the aforementioned split gate flash memory, the source region of the second memory cell and the first memory cell is formed in the second active layer. Furthermore, the select gates in the second direction are serially connected together.

The aforementioned split gate flash memory further includes an inter-gate dielectric layer formed on the sidewalls of the stacked gate structures. The inter-gate dielectric layer can be fabricated by silicon oxide, for example.

The aforementioned split gate flash memory further includes a select gate dielectric layer formed between the select gate and the first active layer. The select gate dielectric layer can be fabricated by silicon oxide, for example.

In the aforementioned split gate flash memory, the stacked gate structure further includes a tunneling dielectric layer formed between the floating gate and the first active layer. The tunneling dielectric layer can be fabricated by silicon oxide, for example.

In the aforementioned split gate flash memory, the stacked gate structure further includes a cap layer formed between the floating gate and the select gate.

Because the memory cell of the split gate flash memory in the present invention has a three-dimensional channel path, the channel length is increased. As a result, the size of each memory cell is reduced and the level of integration of the devices is increased.

The present invention also provides a method of manufacturing a split gate flash memory. First, a substrate is provided. Then, an active layer protruding above the surface of the substrate is formed over the substrate. Thereafter, a plurality of device isolation layers is formed on the sides of the active layer. The surface of the device isolation layers is lower than the surface of the active layer. After that, at least a stacked gate structure having a floating gate therein is formed over the substrate. The floating gate is formed across the active layer. Then, a source region is formed in the active layer on a first side of the stacked gate structure and a select gate is formed on the sidewall of a second side of the stacked gate structure and on the active layer. Thereafter, a drain region is formed in the active layer on one side of the select gate.

In the aforementioned method of manufacturing a split gate flash memory, the stacked gate structure further includes a tunneling dielectric layer formed between the floating gate and the active layer and a cap layer formed on the floating gate.

In the aforementioned method of manufacturing a split gate flash memory, the process of forming the stacked gate structure on the substrate includes the following steps. First, a dielectric layer, a first conductive layer and a mask layer are sequentially formed over the substrate. Then, the mask layer is patterned to form an opening that exposes a portion of the first conductive layer. After forming a cap layer over the exposed first conductive layer, the mask layer is removed. Thereafter, using the cap layer as a mask, the first conductive layer and the dielectric layer are etched to form the stacked gate structure.

In the aforementioned method of manufacturing a split gate flash memory, the process of forming the select gate on the sidewall on the second side of the stacked gate structure and on the active layer includes forming a second conductive layer over the substrate. Thereafter, the second conductive layer is patterned to form the select gate on the sidewall on the second side of the stacked gate structure and on the active layer.

In the aforementioned method of manufacturing a split gate flash memory, an inter-gate dielectric layer is formed on the sidewalls of the stacked gate structure and a select gate dielectric layer is formed on the active layer on the second side of the stacked gate structure after forming the stacked gate structure on the substrate. The method of forming the inter-gate dielectric layer on the sidewalls of the stacked gate structure includes performing a thermal oxidation process.

In the aforementioned method of manufacturing a split gate flash memory, the process of forming the active layer on the substrate includes forming a plurality of trenches in the substrate.

The present invention also provides an alternative method of manufacturing a split gate flash memory. First, a substrate is provided. Then, a plurality of first active layers aligned in a first direction parallel to one another and a plurality of second active layers aligned in a second direction parallel to one another are formed on the substrate such that the first direction and the second direction are formed across each other. Furthermore, the first active layers and the second active layers protrude above the surface of the substrate. Thereafter, a plurality of device isolation layers is formed on the respective sides of the first active layers and the second active layers. The surface of the device isolation layers is lower than the surface of the first active layers and the second active layers. After that, a plurality of stacked gate structures is formed on the substrate. The stacked gate structures are aligned to form an array. Each stacked gate structure includes at least a floating gate. The floating gate is formed across the first active layer. Then, a plurality of source regions is formed in a portion of the first active layer and the second active layer between two adjacent stacked gate structures. The source regions in the second direction are serially connected together through the second active layers. A plurality of select gates is formed on one sidewall of the stacked gate structures and on the first active layers respectively. The select gates in the second direction are electrically connected together. After that, a plurality of drain regions is formed in the respective first active layers on a reciprocal side of the select gate and the source region.

In the aforementioned method of manufacturing a split gate flash memory, each stacked gate structure includes a tunneling dielectric layer formed between the floating gate and the active layer and a cap layer formed on the floating gate.

In the aforementioned method of manufacturing a split gate flash memory, the process of forming the stacked gate structures on the substrate includes the following steps. First, a dielectric layer, a first conductive layer and a mask layer are sequentially formed over the substrate. Then, the mask layer is patterned to form a plurality of openings that exposes a portion of the first conductive layer. After forming a cap layer over the exposed first conductive layer, the mask layer is removed. Thereafter, using the cap layer as a mask, the first conductive layer and the dielectric layer are etched to form the stacked gate structures.

In the aforementioned method of manufacturing a split gate flash memory, the process of forming the select gates on one sidewall of the stacked gate structures and on the first active layers includes forming a second conductive layer over the substrate. Thereafter, the second conductive layer is patterned to form the select gates on the sidewall of the stacked gate structures and on the first active layers.

In the aforementioned method of manufacturing a split gate flash memory, inter-gate dielectric layers are formed on the sidewalls of the stacked gate structures and select gate dielectric layers are formed on the first active layers on one side of the stacked gate structures after forming the stacked gate structures on the substrate.

In the aforementioned method of manufacturing a split gate flash memory, the method of forming the inter-gate dielectric layers on the sidewalls of the stacked gate structures includes performing a thermal oxidation process.

In the aforementioned method of manufacturing a split gate flash memory, the process of forming the first active layer and the second active layers on the substrate includes forming a plurality of trenches in the substrate.

In the method of manufacturing a split gate flash memory according to the present invention, the floating gates and the select gates are formed on and across the active layers. Therefore, the memory cells have three-dimensional channel so that the channel length is increased. As a result, the size of each memory cell is reduced and the level of integration of the devices is increased.

Furthermore, the width of the channel can be determined by the depth of the trench and the thickness of the device isolation layer filling the trench.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
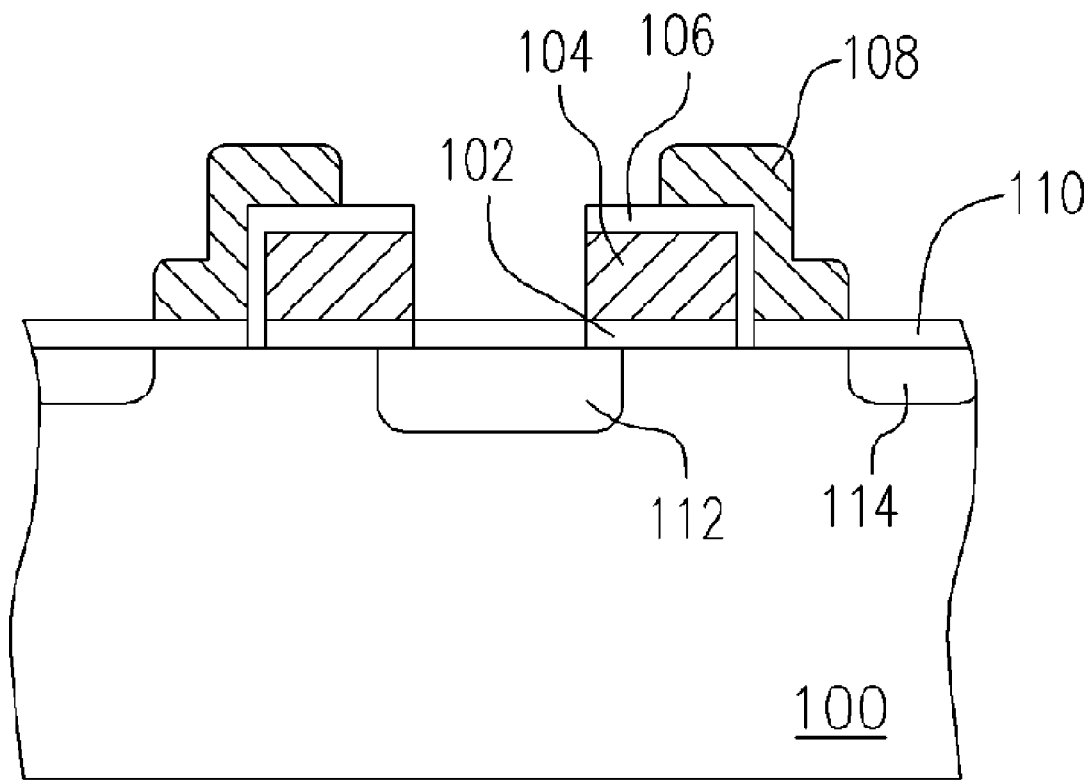
FIG. 1 is a schematic cross-sectional view showing the structure of a conventional split-gate flash memory cell.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
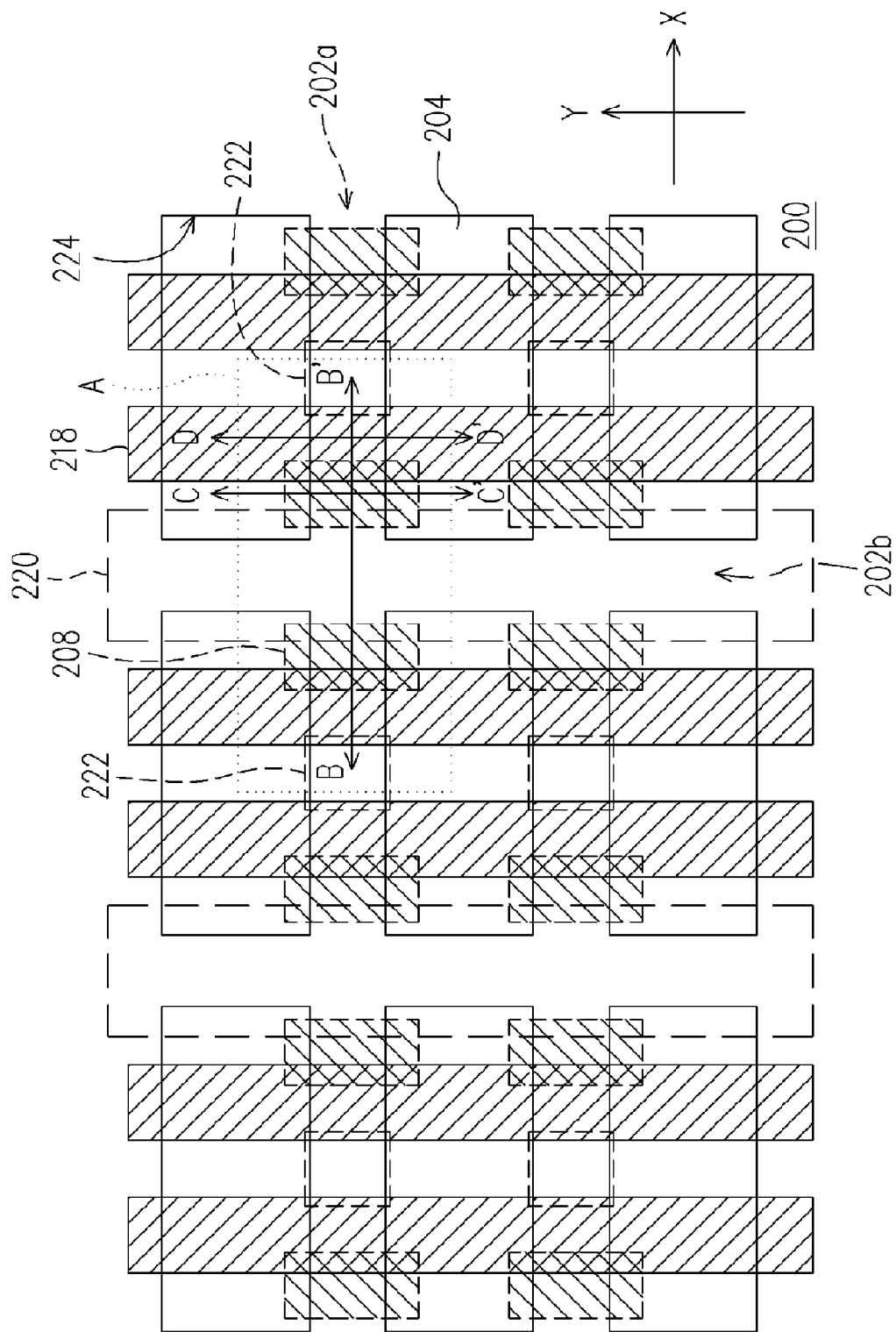
FIG. 2A is a top view of a split gate flash memory according to one preferred embodiment of the present invention.
Figure 2B:
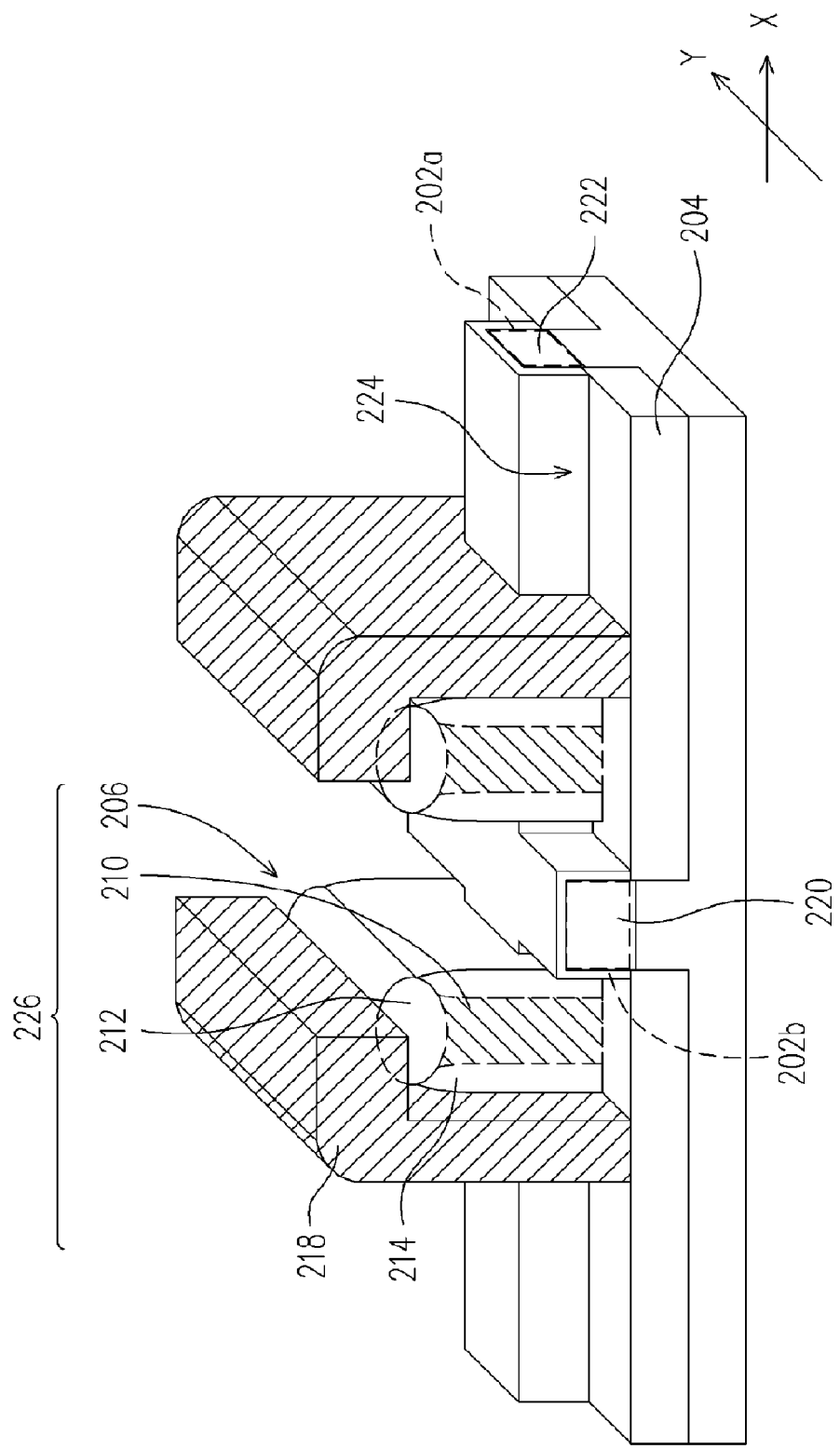
FIG. 2B is a perspective view showing the 'A' portion of the structure in FIG. 2A.
Figure 2C:
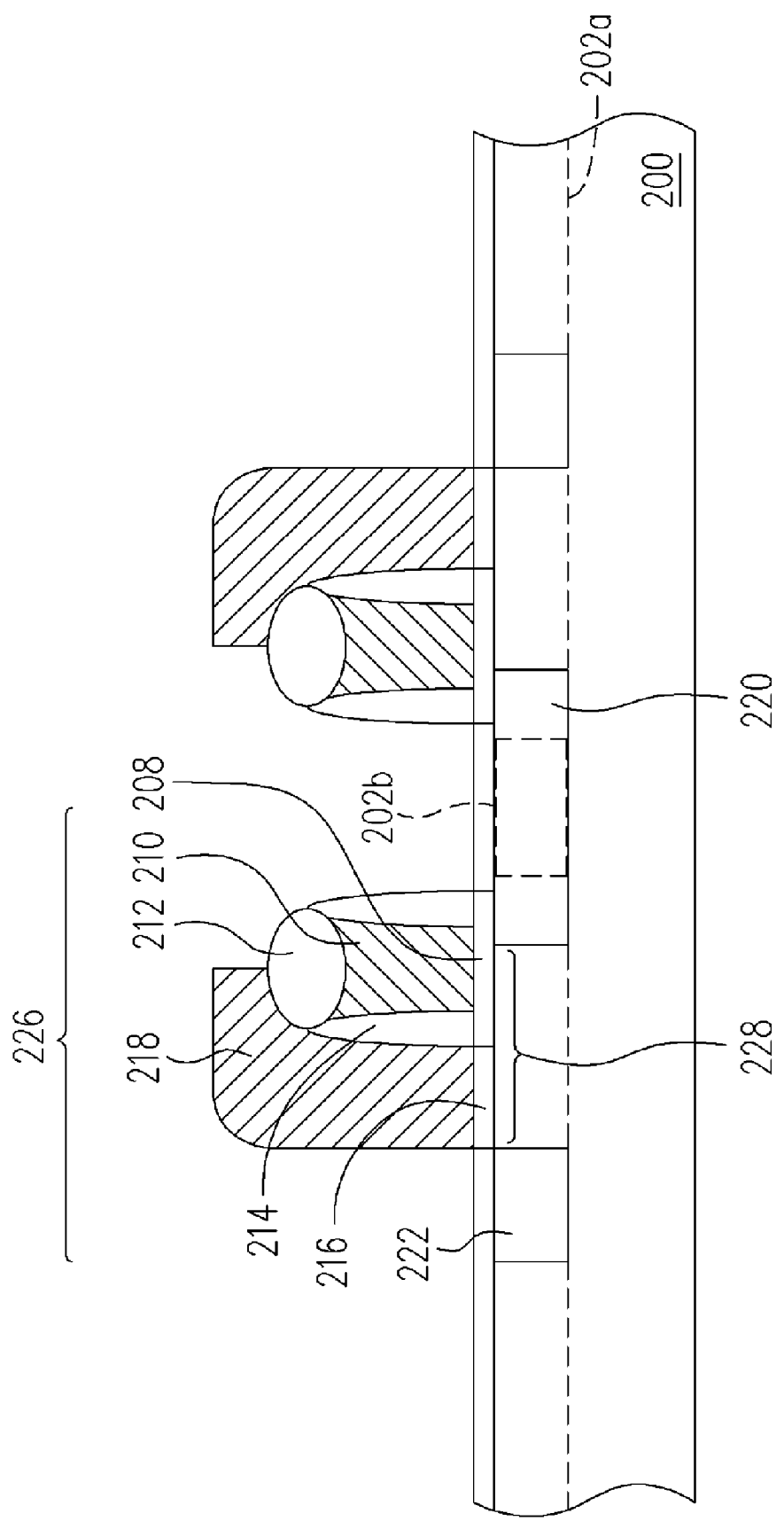
FIG. 2C is a cross-sectional view showing the structure along line B–B' of FIG. 2A.
Figure 2D:
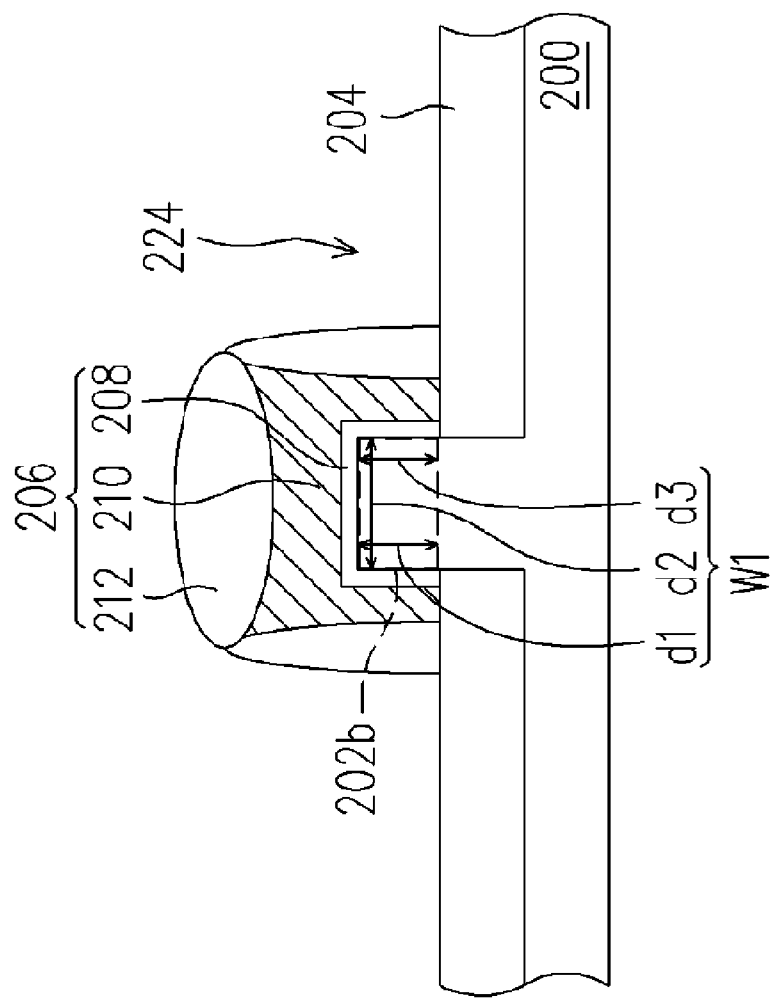
FIG. 2D is a cross-sectional view showing the structure along line C–C' of FIG. 2A.
Figure 2E:
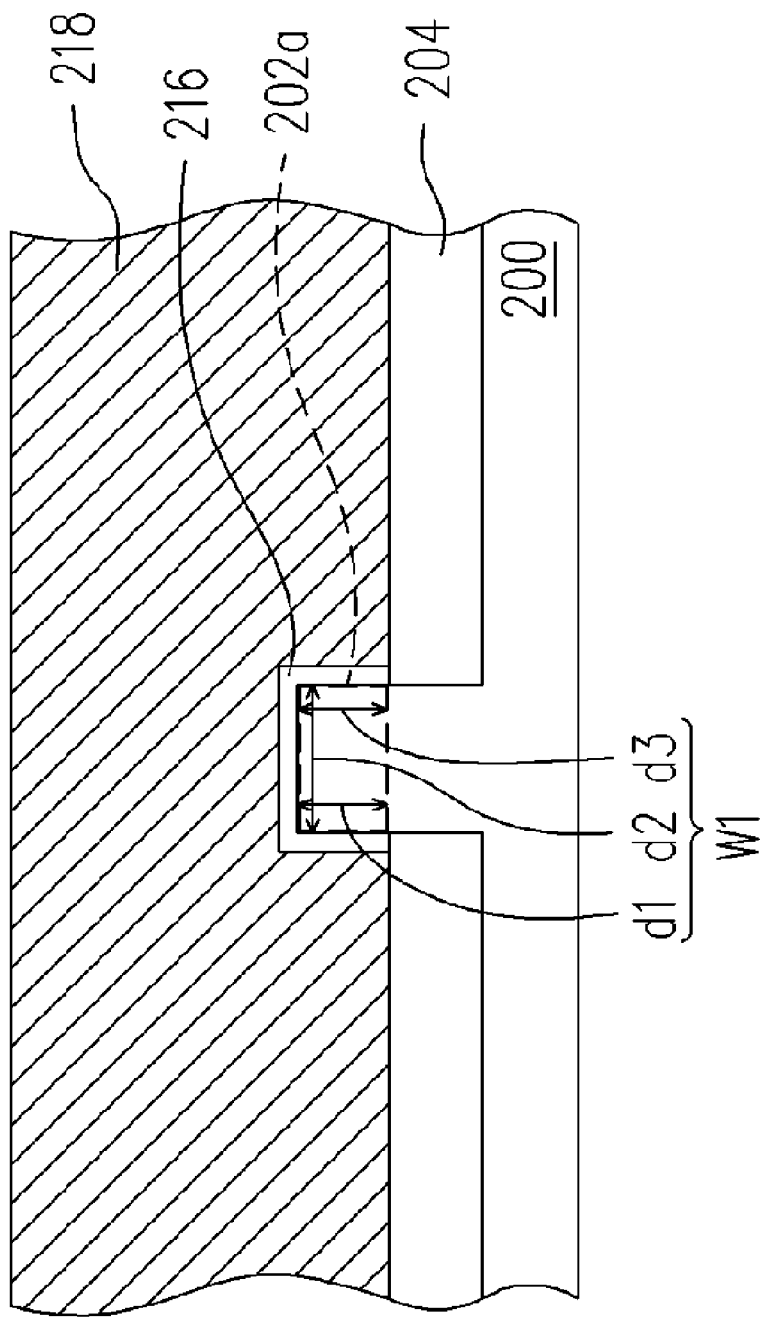
FIG. 2E is a cross-sectional view showing the structure along line D–D' of FIG. 2A.

FIG. 2A is a top view of a split gate flash memory according to one preferred embodiment of the present invention. FIG. 2B is a perspective view showing the 'A' portion of the structure in FIG. 2A. FIG. 2C is a cross-sectional view showing the structure along line B–B' of FIG. 2A. FIG. 2D is a cross-sectional view showing the structure along line C–C' of FIG. 2A. FIG. 2E is a cross-sectional view showing the structure along line D–D' of FIG. 2A.

FIGS. 2A through 2E are used to describe the structure of a split gate flash memory according to the present invention. The flash memory cell of the present invention includes at least a substrate 200, an active layer 202a, another active layer 202b, a device isolation layer 204, a stacked gate structure 206, an inter-gate dielectric layer 214, a select gate dielectric layer 216, a select gate 218, a source region 220 and a drain region 222.

The substrate 200 is a silicon substrate, for example. The active layers 202a and 202b protrude above the surface of the substrate 200. The active layers 202a and 202b are defined by forming a plurality of trenches 224 in the substrate 200, for example. The active layers 202a are aligned, for example, in an X direction parallel to one another. Moreover, the active layers 202a extend in the X direction in the form of linear strips. The active layers 202b are aligned, for example, in a Y direction parallel to one another. The X direction and the Y direction cross over each other. In other words, the active layers 202a are formed across the active layers 202b.

The device isolation layers 204 are disposed on the respective sides of the active layers 202a and the active layers 202b. In other words, the device isolation layers 204 are disposed in the trenches 224 to isolate the substrate 200 from the stacked gate structures 206 and the select gates 218. Furthermore, the surface of the device isolation layers 204 is lower than the surface of the active layers 202a and the active layers 202b. That is, the active layers 202a and 202b protrude above the surface of the device isolation layers 204 to form fin-like structures. The device isolation layers 204 are fabricated by silicon oxide, for example.

Each stacked gate structure 206 includes, for example, a tunneling dielectric layer 208, a floating gate 210 and a cap layer 212. The floating gate 210 is formed on the substrate 200 across the active layer 202a and the tunneling dielectric layer 208 is formed between the floating gate 204 and the active layer 202a. The floating gate 210 is fabricated by doped polysilicon, for example. The tunneling dielectric layer is formed between the floating gate 204 and the substrate 200 and is fabricated by silicon oxide, for example.

The cap layer 206 is formed on the floating gate 204 and is fabricated by silicon oxide, for example.

The inter-gate dielectric layers 214 are formed on the sidewalls of the stacked gate structures 206. The inter-gate dielectric layers 214 are fabricated by silicon oxide, for example.

The select gates 218 are formed on one side of the stacked gate structures 206 across the active layer 202a. As shown in FIG. 2A, the select gates 218 are serially connected in the Y direction, for example. The select gates 218 are fabricated by doped polysilicon, for example.

The select gate dielectric layers 216 are formed between the select gates 218 and the active layers 202a. The select gate dielectric layers 216 are fabricated by silicon oxide, for example. The source region 220 is formed in the active layer 202a and the active layer 202b on another side of the of the stacked gate structure 206. The source regions 220 in the Y direction are connected together through the active layers 202b, for example. The source regions 220 extend to an area underneath the floating gate 210 of various memory cells. The drain regions 222 are formed in the active layers 202a on one side of the select gates 218, for example. The source region 220 and the drain region 222 are disposed on reciprocal locations separated from each other by the stacked gate structure 206 and the select gate 218.

The stacked gate structure 206 (including the tunneling dielectric layer 208, the floating gate 210 and the cap layer 212), the select gate 218, the select gate dielectric layer 216, the inter-gate dielectric layer 214, the source region 220 and the drain region 222 together form a memory cell 226. A plurality of the memory cells 226 is formed over the substrate 200. The memory cells 226 are aligned to form an array. As shown in FIG. 2B, every pair of adjacent memory cells 226 has an identical structure that shares a source region 220.

As shown in FIGS. 2B, 2C, 2D and 2E, both the floating gate 210 and the select gate 218 of the memory cell 226 are formed across the fin-like active layer 202a. Therefore, the memory cell 226 has a three-dimensional channel path leading to a greater channel 228 width. For example, as shown in FIG. 2D, the channel width W1 underneath the floating gate 210 is the sum of the distances d1, d2 and d3, and as shown in FIG. 2E, the channel width W2 underneath the select gate 210 is the sum of the distances d1, d2 and d3. That is why the dimension of each memory cell can be reduced to increase the overall level of integration of the devices.

Furthermore, the total width of the channel 228 is the sum of the distances d1, d2 and d3 and the distance d1 and d3 is determined by the depth of the trenches 224 and the thickness of the device isolation layer 204 filling the trenches 224. Hence, the width of the channel 228 can be easily adjusted whenever it is required.

FIGS. 3A through 3G are schematic cross-sectional views showing the steps for fabricating a split gate flash memory according to one preferred embodiment of the present invention. In fact, FIGS. 3A through 3G are perspective views of the 'A' portion of the FIG. 2A for showing the steps in the fabrication process.

Figure 3A:
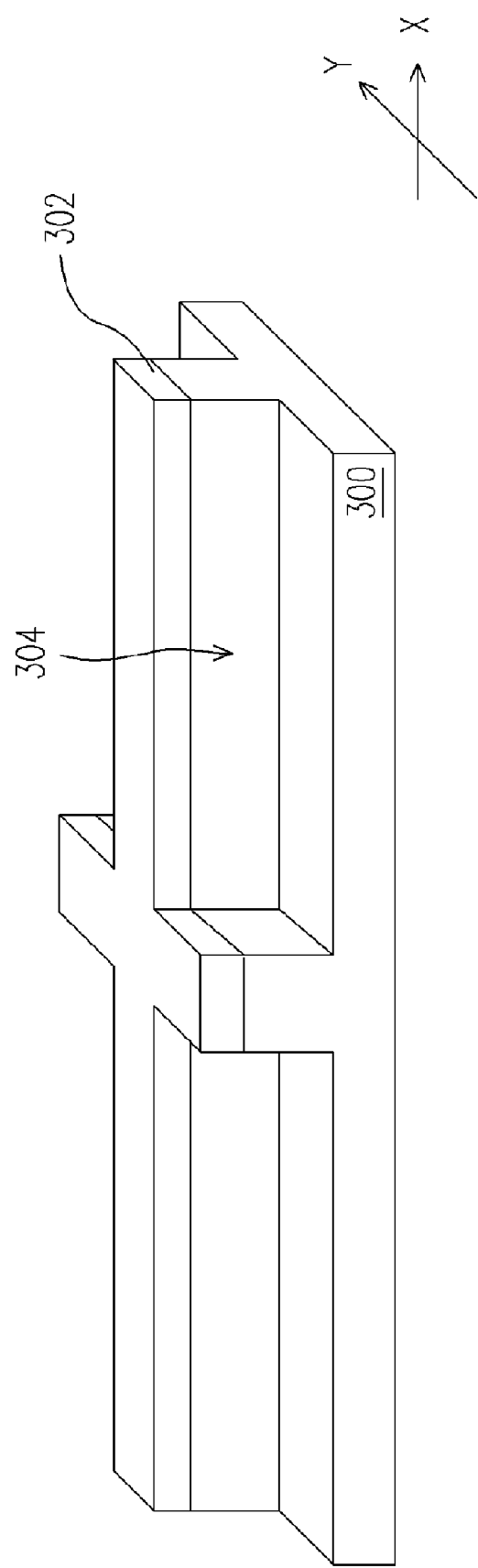
FIGS. 3A through 3G are schematic cross-sectional views showing the steps for fabricating a split gate flash memory according to one preferred embodiment of the present invention.

First, as shown in FIG. 3A, a substrate such as a silicon substrate is provided. Then, a mask layer 302 is formed on the substrate 300. The mask layer 302 is a silicon nitride layer formed, for example, by performing a chemical vapor deposition process. Obviously, a pad oxide layer (not shown) can be formed between the mask layer 302 and the substrate 300. The pad oxide layer is a silicon oxide layer formed, for example, by performing a thermal oxidation process. After patterning the mask layer 302, a portion of the substrate 300 is removed to form trenches 304 in the substrate and define an active region using the mask layer 302 as a mask. The process of removing a portion of the substrate 300 includes performing a reactive ion etching operation, for example.

Figure 3B:
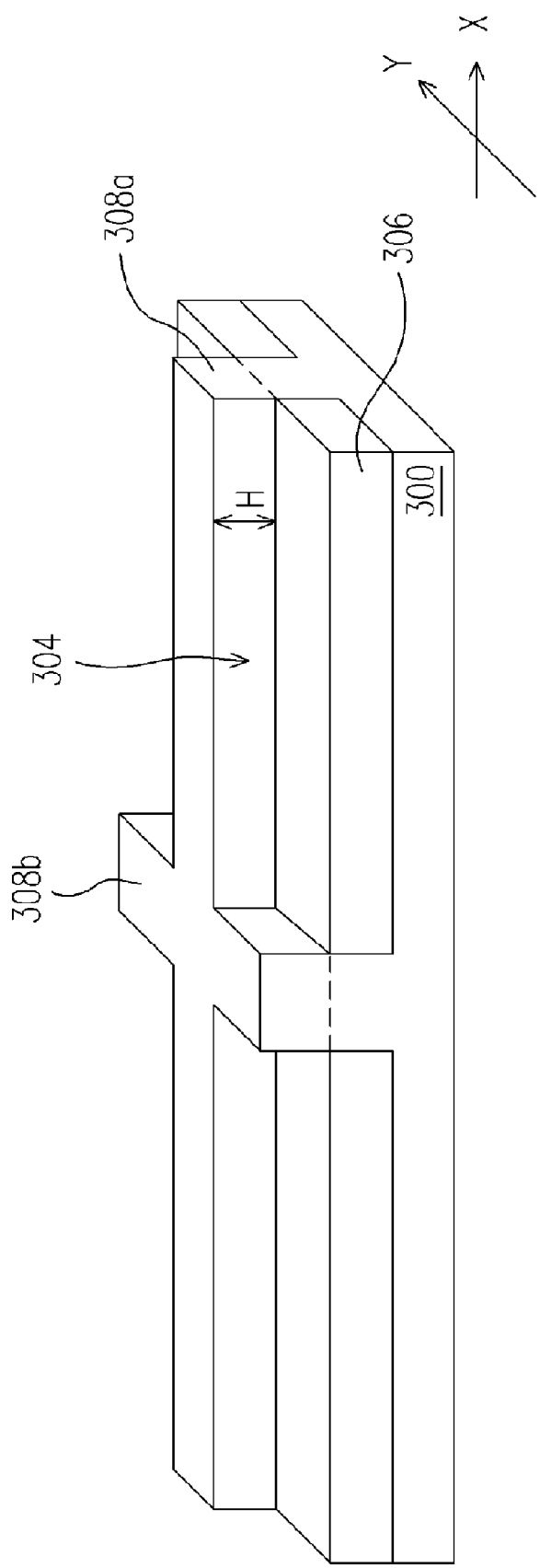

As shown in FIG. 3B, device isolation layers 306 are formed in the trenches 304. The top surface of the device isolation layers 306 is lower than the top surface of the substrate 300. That portion of the substrate 300 protruding above the device isolation layers 306 is called the active layers 308a and 308b. The active layer 308a appearing as a linear strip extends in the X direction, for example. The active layer 308b appearing as a linear strip extends in the Y direction, for example. In other words, the active layers 308a and 308b cross over each other. In the present embodiment, only one single active layer 308a and one active layer 308b are shown. In practice, a plurality of active layers 308a aligned in the X direction parallel to one another and a plurality of active layers 308b aligned in the Y direction parallel to one another may be formed as shown in FIG. 2A.

The method of forming the device isolation layers 306 includes forming an insulating material layer (not shown) over the substrate 300. The insulating material layer has a thickness greater than the sum of the depth of the trench 304 and the thickness of the mask layer 302. Thereafter, a planarization operation is carried out to planarize the upper surface of the insulating material layer. The method of planarizing the insulating material layer includes performing a chemical-mechanical polishing operation, for example. After that, a portion of the insulating material layer is removed so that the top surface of the insulating material layer is lower than the top surface of the substrate 300, thereby forming the device isolation layers 306. The method of removing a portion of the insulating material layer includes performing an etching back operation, for example. The height H of the active layer 308 is determined by the depth of the trench 304 and the thickness of the device isolation layer 206. The height H of the active layer 308 will directly affect the channel width of a subsequently formed memory cell.

After forming the device isolation layers 306, the mask layer 302 is removed. The method of removing the mask layer 302 includes performing a wet etching operation, for example.

Figure 3C:
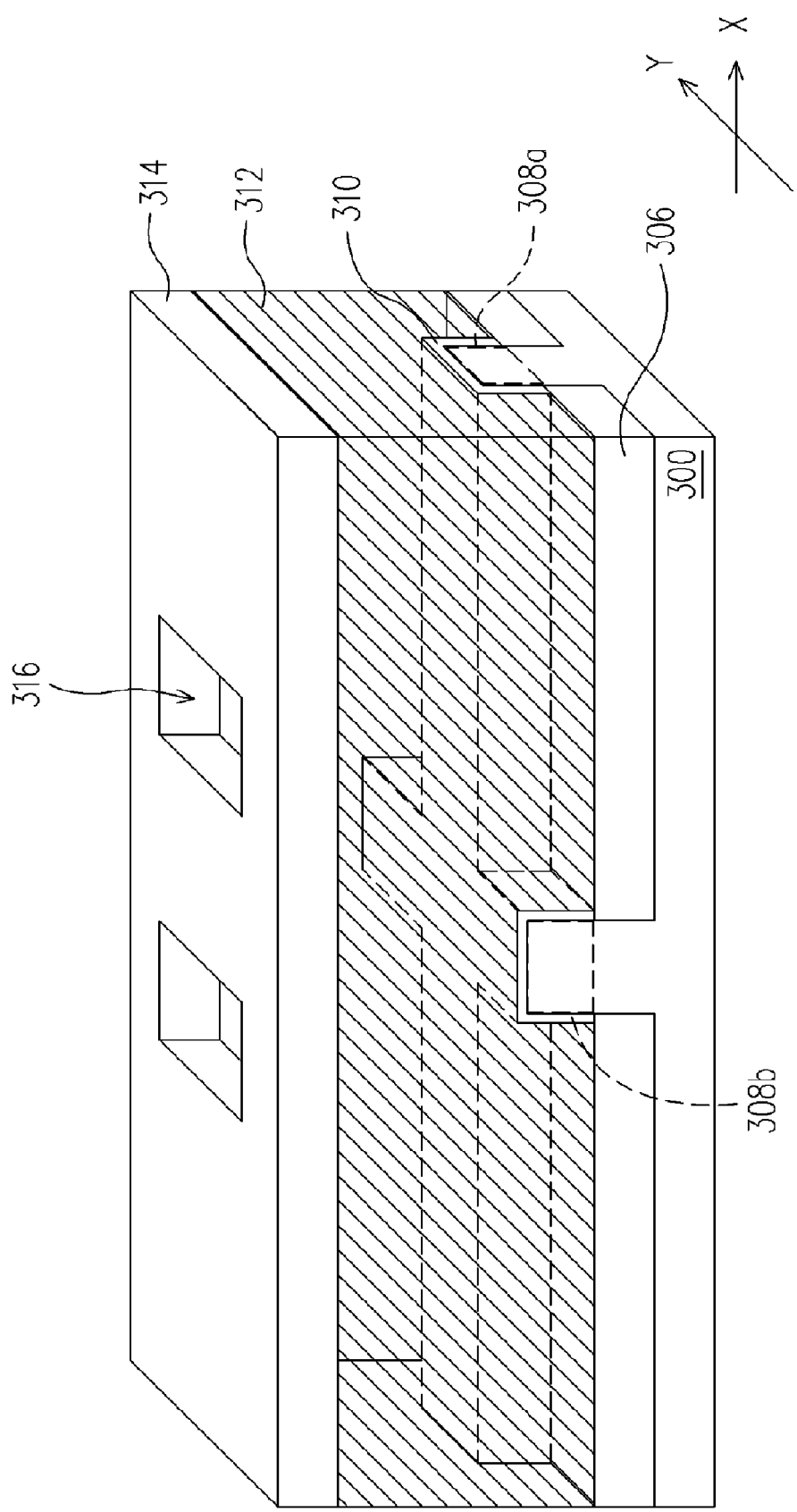

As shown in FIG. 3C, a dielectric layer 310 is formed over the substrate 300. The dielectric layer 310 is a silicon oxide layer formed, for example, by performing a thermal oxidation process.

Thereafter, a conductive layer 312 fabricated by doped polysilicon is formed over the dielectric layer 310. The method of forming the conductive layer 312 includes depositing undoped polysilicon in a chemical vapor deposition to form an undoped polysilicon layer and performing an ion implantation on the undoped polysilicon layer thereafter. Alternatively, the conductive layer 312 is formed in a chemical vapor deposition process with in-situ ion implantation.

After that, a mask layer 314 is formed over the conductive layer 312. The mask layer 314 is a silicon nitride layer formed, for example, by performing a chemical vapor deposition process. The mask layer 314 is patterned to form a plurality of openings 316 that exposes the conductive layer 312.

Figure 3D:
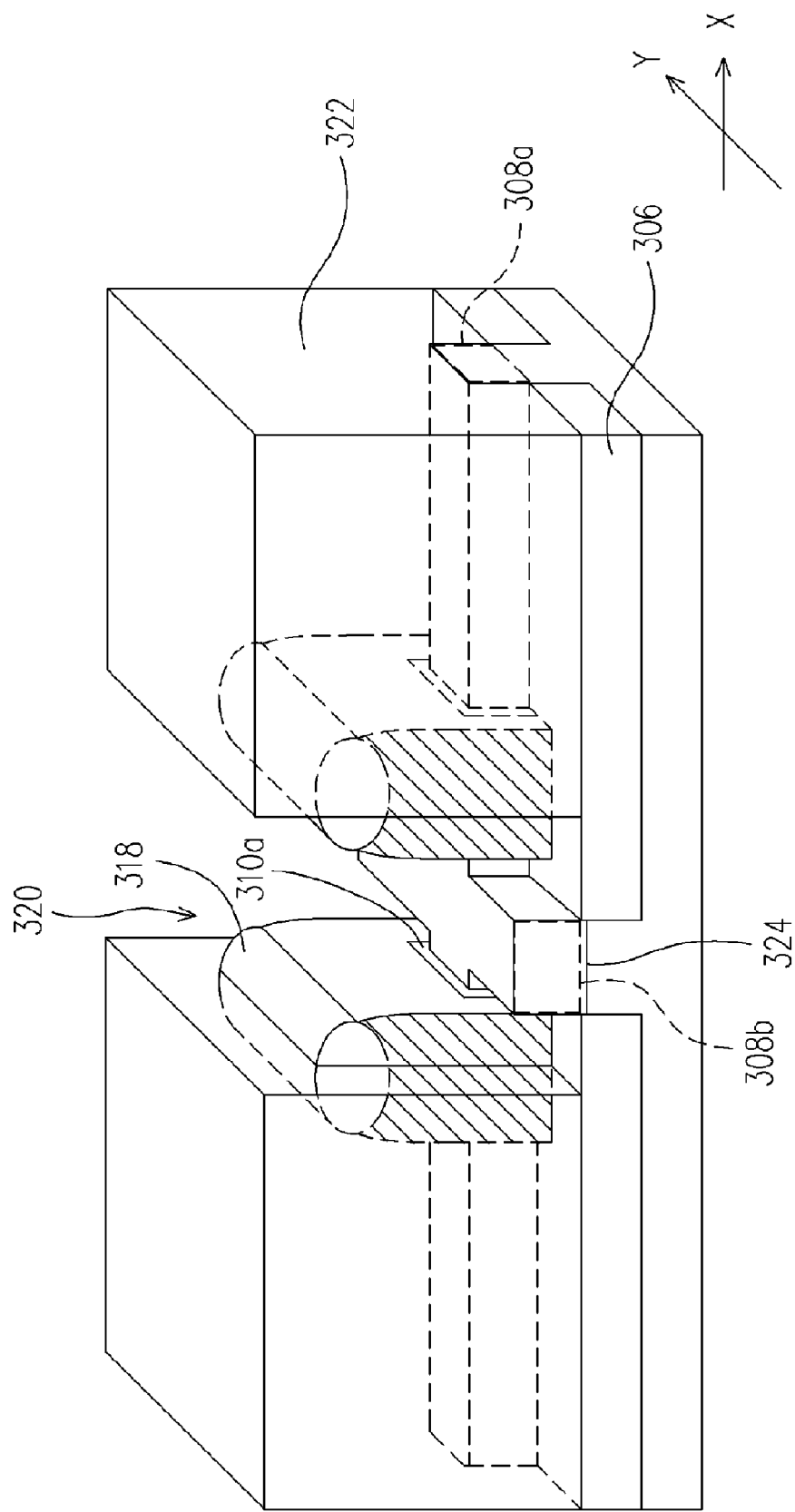

As shown in FIG. 3D, a cap layer 318 is formed on the exposed conductive layer 312 within the openings 316. The cap layer 318 is a silicon oxide layer formed, for example, by performing a thermal oxidation process. After forming the cap layer 310, the mask layer 314 is removed. Thereafter, using the cap layer 318 as a self-aligning mask, the conductive layer 312 and the dielectric layer 310 are etched until the substrate 300 is exposed to form a conductive layer 312a and a tunneling dielectric layer 310a. The cap layer 318, the conductive layer 312a and the tunneling dielectric layer 310a together form a stacked gate structure 312 with the conductive layer 312a serving as the floating gate of a memory cell.

Thereafter, a patterned photoresist layer 322 is formed over the substrate 300. The patterned photoresist layer 322 exposes the areas for forming the source regions. An ion implant process is carried out to form a source region 324 in the substrate 300 on one side of the stacked gate structure 320. The source region 324 is formed in the active layers 308a and 308b between two adjacent stacked gate structures 320. The source regions 324 in the Y direction are connected through the active layer 308b, for example. In other words, the two subsequently formed adjacent memory cells will share the same source region 324.

Figure 3E:
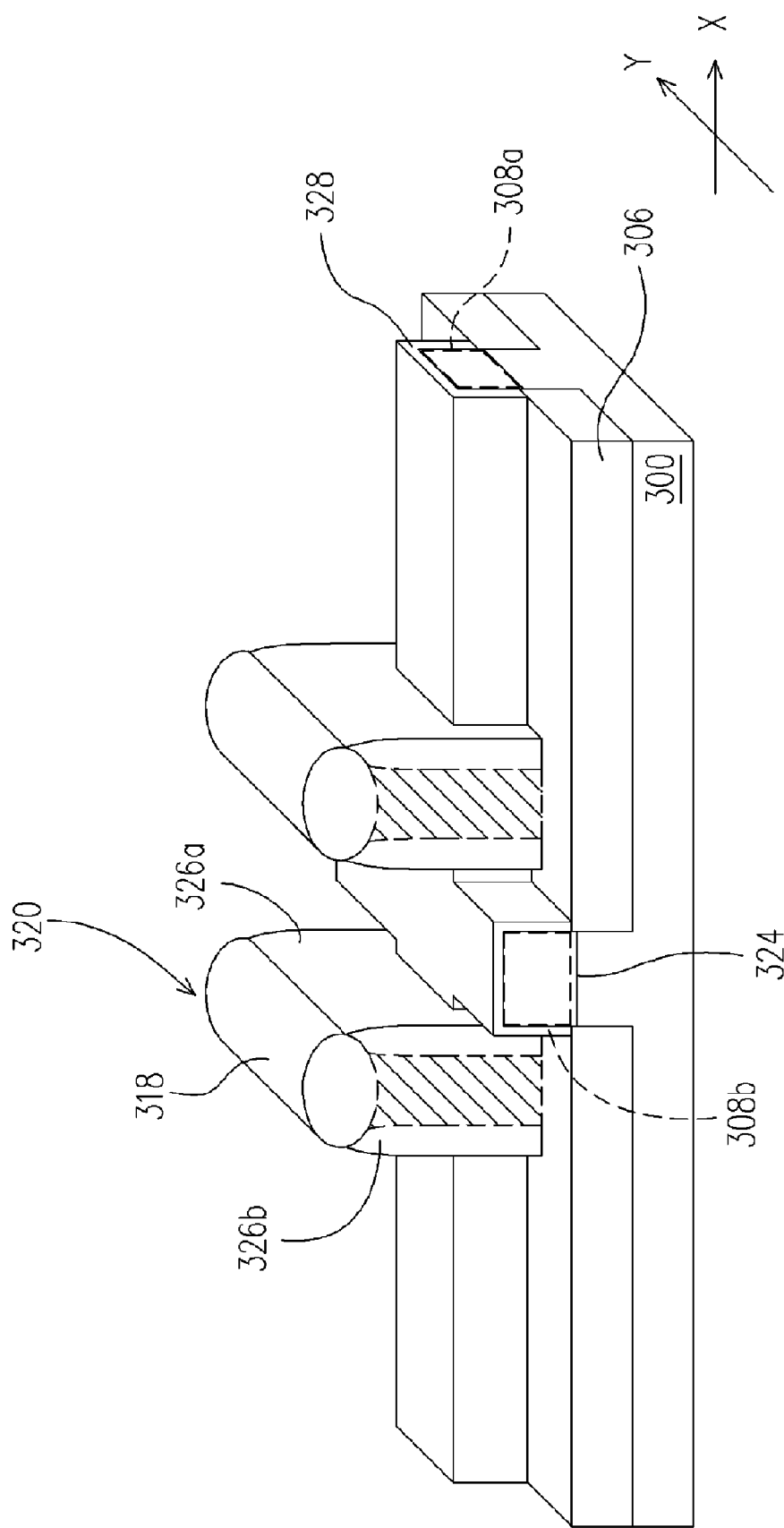

As shown in FIG. 3E, the patterned photoresist layer 322 is removed. Thereafter, inter-gate dielectric layers 326a and 326b are formed on the respective sidewalls of the stacked gate structures 320. The inter-gate dielectric layers 326a and 326b are silicon oxide layers or silicon oxide/nitride composite layers formed, for example, by performing a thermal oxidation process. Obviously, the process of forming the inter-gate dielectric layers 326a and 326b may include performing a thermal oxidation process to form a silicon oxide layer. Thereafter, a chemical vapor deposition process is performed to deposit a silicon oxide layer or a silicon nitride layer. Finally an anisotropic etching operation is carried out to remove a portion of the silicon oxide layer and the silicon nitride layer.

Thereafter, a dielectric layer 328 is formed over the substrate 300 (the active layers 308a and 308b). The dielectric layer 328 is a silicon oxide layer formed, for example, by performing a thermal oxidation process. Obviously, the dielectric layer 328 will also form over the source region 324. In addition, a thin silicon oxide layer will also form on the surface of the inter-gate dielectric layers 326a and 326b. If the inter-gate dielectric layers 326a and 326b are silicon oxide/nitride composite layers, then the inter-gate dielectric layers 326a and 326b are converted to oxide/nitride/oxide structures after forming the dielectric layer 328.

Figure 3F:
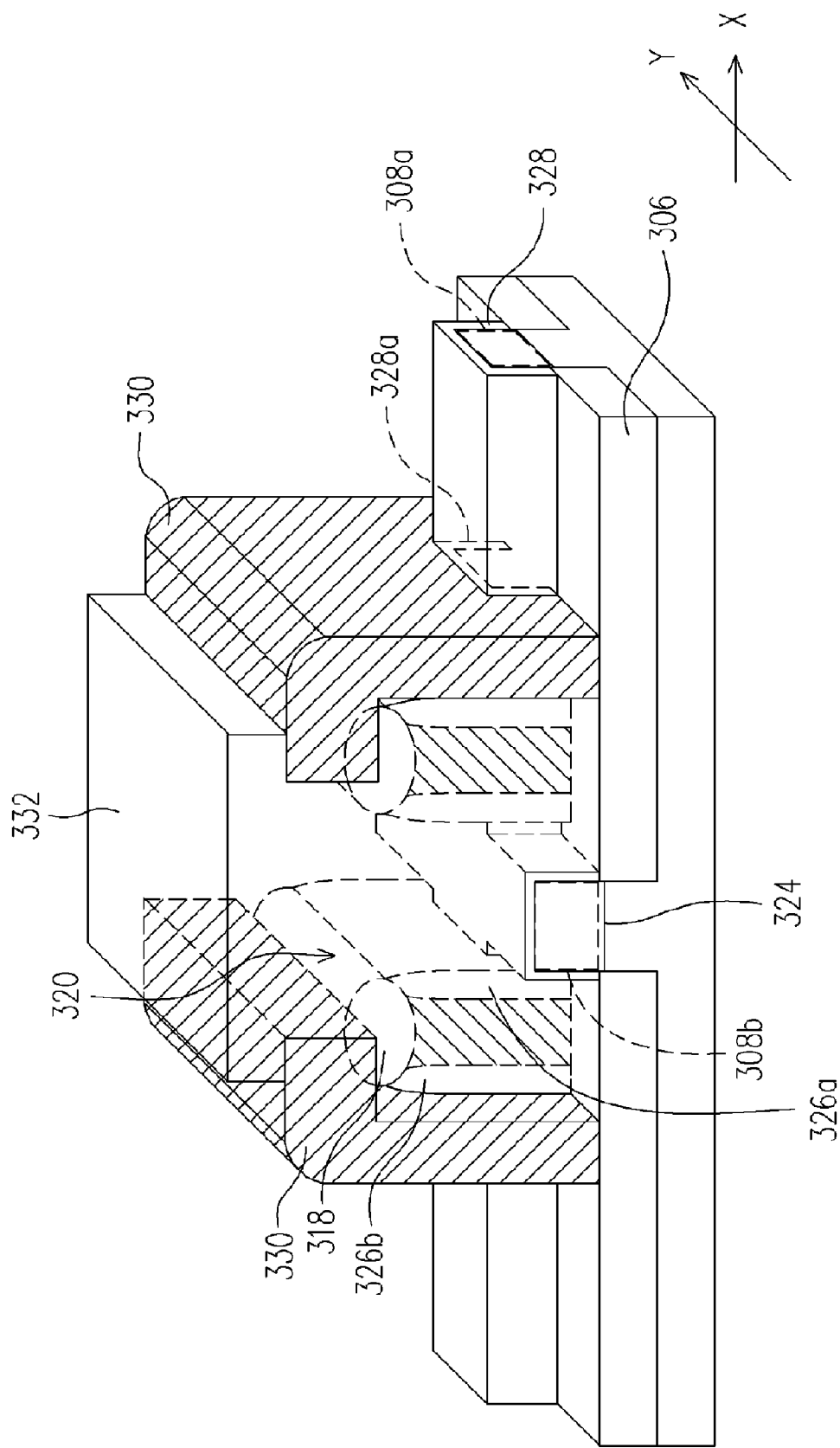

As shown in FIG. 3F, a select gate 330 is formed on that side of the sidewall of the stacked gate structure 312 where the inter-gate dielectric layer 326b are formed thereon. The select gate 330 is formed, for example, by depositing a conductive material layer (not shown) on the substrate 300 and patterning the conductive material layer thereafter. The select gate 330 can be a doped polysilicon layer formed, for example, by depositing doped polysilicon in a chemical vapor deposition and performing an ion implant process, or performing an in-situ dopant implant in a chemical vapor deposition. The dielectric layer 328 between the select gate 330 and the active layer 308a serves as a select gate dielectric layer 328a.

Thereafter, another patterned photoresist layer 332 is formed over the substrate 300. The patterned photoresist layer 332 covers the area above the source regions 324 and exposes the areas for forming the drain regions.

Figure 3G:
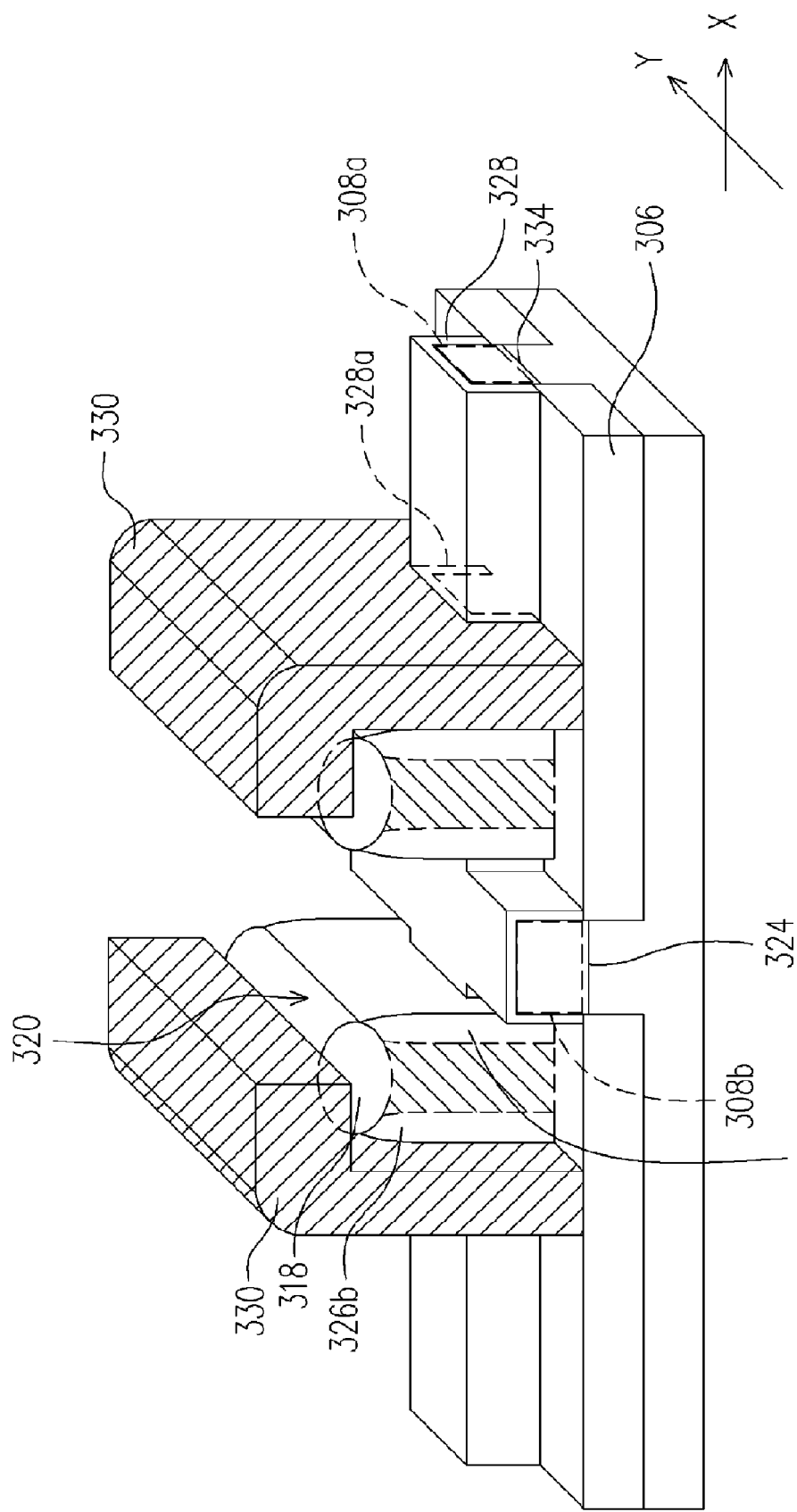

As shown in FIG. 3G, an ion implantation is carried out to form a drain region 334 in the substrate 300 (the active layer 308a) on one side of the select gate 330. Thereafter, the patterned photoresist layer 332 is removed and then the remaining steps necessary for forming a complete split gate flash memory cell performed. Since these steps involve familiar conventional processes, a detailed description is omitted.

In the aforementioned embodiment, the floating gate 312a and the select gate 330 are formed on and across the active layer 308a. Therefore, the memory cells have a three-dimensional channel path with a greater channel width. Furthermore, the width of the channel can be determined through the depth of the trench 304 and the thickness of the device isolation layer 306 filling the trench 304.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A split gate flash memory, comprising:
   a substrate;
   at least one active layer disposed on the substrate and protruded from the surface of the substrate;
   a plurality of device isolation layers disposed on the sides of the active layer, wherein the surface of the device isolation layers is lower than the surface of the active layer; and
   at least one memory cell disposed on the substrate, the memory cell comprising:
   a stacked gate structure having at least a floating gate, wherein the floating gate is formed across the active layer;
   a select gate disposed on a top of the stacked gate structure and on a sidewall of the stacked gate structure in a extent direction of the active layer and across the active layer;
   a source region disposed in the active layer on a second side of the stacked gate structure and extended to an area underneath the floating gate, wherein the second side and the first side are disposed in reciprocal locations; and
   a drain region disposed in the active layer on one side of the select gate.

2. The split gate flash memory of claim 1, further comprising an inter-gate dielectric layer disposed on the sidewalls of the stacked gate structure.

3. The split gate flash memory of claim 2, wherein material constituting the inter-gate dielectric layer comprises silicon oxide.

4. The split gate flash memory of claim 1, further comprising a select gate dielectric layer disposed between the select gate and the active layer.

5. The split gate flash memory of claim 4, wherein the material constituting the select gate dielectric layer comprises silicon oxide.

6. The split gate flash memory of claim 1, wherein the stacked gate structure further comprises a tunneling dielectric layer disposed between the floating gate and the active layer.

7. The split gate flash memory of claim 6, wherein the material constituting the tunneling dielectric layer comprises silicon oxide.

8. The split gate flash memory of claim 1, wherein the stacked gate structure further comprises a cap layer disposed between the floating gate and the select gate.

9. The split gate flash memory of claim 1, wherein the material constituting the floating gate and the select gate comprises doped polysilicon.

10. A split gate flash memory, comprising:
- a substrate;
- a plurality of first active layers disposed on the substrate, wherein the first active layers are aligned in a first direction parallel to one another and protruded from the surface of the substrate;
- a plurality of second active layers disposed on the substrate, wherein the second active layers are aligned in a second direction parallel to another and the second direction is formed across the first direction;
- a plurality of device isolation layers disposed on the sides of the first active layers, wherein the surface of the device isolation layers is lower than the surface of the first active layers;
- a first memory cell disposed on the substrate and across the first active layer, the first memory cell comprising:
  - a stacked gate structure having at least a floating gate, wherein the floating gate is formed across the first active layer;
  - a select gate disposed on a first side of the stacked gate structure and across the first active layer;
  - a source region disposed in the first active layer on a second side of the floating gate, wherein the second side and the first side are disposed on reciprocal locations; and
  - a drain region disposed in the first active layer on one side of the select gate; and
- a second memory cell disposed on the substrate and across the first active layer, wherein the second memory cell has a structure identical and symmetry to the first memory cell, and the second memory cell and the first memory cell share the same source region.

11. The split gate flash memory of claim 10, wherein the source region of the second memory cell and the first memory cell are disposed in the second active layers.

12. The split gate flash memory of claim 10, wherein the select gates in the second direction is serially connected together.

13. The split gate flash memory of claim 10, further comprising an inter-gate dielectric layer disposed on the sidewalls of the stacked gate structure.

14. The split gate flash memory of claim 13, wherein the material constituting the inter-gate dielectric layer comprises silicon oxide.

15. The split gate flash memory of claim 10, further comprising a select gate dielectric layer disposed between the select gate and the first active layer.

16. The split gate flash memory of claim 15, wherein the material constituting the select gate dielectric layer comprises silicon oxide.

17. The split gate flash memory of claim 10, wherein the stacked gate structure further comprises a tunneling dielectric layer disposed between the floating gate and the first active layer.

18. The split gate flash memory of claim 17, wherein die material constituting the tunneling dielectric layer comprises silicon oxide.

19. The split gate flash memory of claim 10, wherein the stacked gate structure further comprises a cap layer disposed between the floating gate and the select gate.

* * * * *